United States Patent
Shiotsuka

(10) Patent No.: US 6,242,966 B1
(45) Date of Patent: Jun. 5, 2001

(54) LEAKAGE CURRENT CORRECTING CIRCUIT

(75) Inventor: Hiroyuki Shiotsuka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/380,068
(22) PCT Filed: Dec. 25, 1997
(86) PCT No.: PCT/JP97/04817
§ 371 Date: Aug. 25, 1999
§ 102(e) Date: Aug. 25, 1999
(87) PCT Pub. No.: WO99/34226
PCT Pub. Date: Jul. 8, 1999
(51) Int. Cl.[7] .................................................. G06G 7/12
(52) U.S. Cl. ........................ 327/362; 327/363; 327/378
(58) Field of Search ................................... 327/362, 363, 327/540, 378, 307; 330/288; 323/315

(56) References Cited

U.S. PATENT DOCUMENTS

| | | | |
|---|---|---|---|
| 5,418,751 | * 5/1995 | Kaiser | 365/212 |
| 5,691,657 | * 11/1997 | Hirano et al. | 327/94 |
| 5,982,197 | * 11/1999 | Ono et al. | 326/98 |

* cited by examiner

Primary Examiner—Toan Tran
(74) Attorney, Agent, or Firm—Oblon, Spivak, McClelland, Maier & Neustadt, P.C.

(57) ABSTRACT

A leakage current correcting circuit for reducing a leakage current flowing into an output of a circuit in a high impedance state. The configuration includes a correcting unit having a current detecting circuit for detecting a leakage current and outputting a current equal to a detected leakage current, and a current supply circuit for receiving the output current from the current detecting circuit as an input and causing a current for offsetting the leakage current flowing into the output of the circuit in a high impedance state.

5 Claims, 5 Drawing Sheets

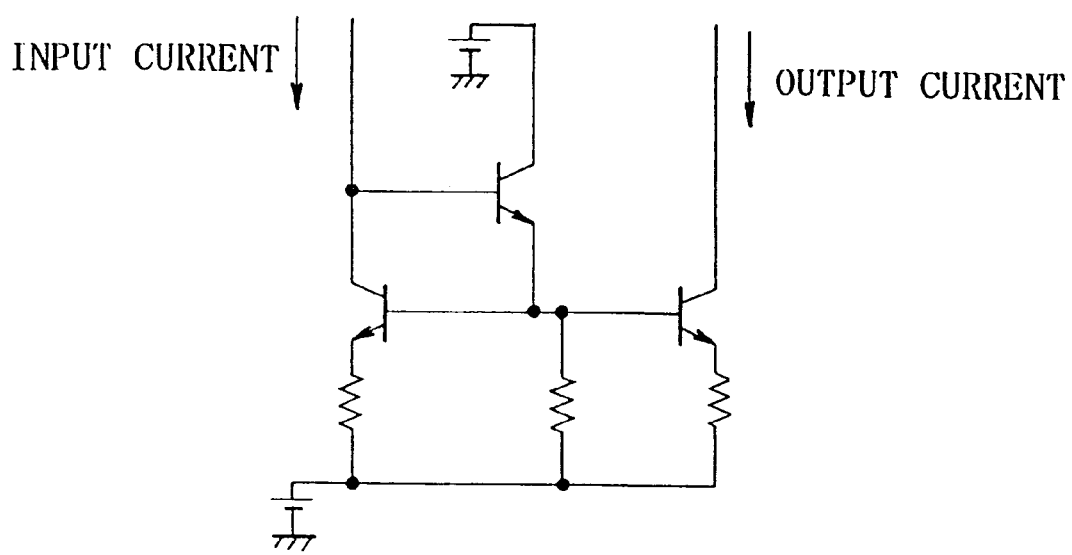
F I G. 5

LEAKAGE CURRENT CORRECTING CIRCUIT

TECHNICAL FIELD

The present invention relates to a semiconductor testing apparatus for testing a semiconductor device, and more particularly to a leakage current correcting circuit for reducing a leakage current in a programmable load circuit or the like which acts as a load for a device under test.

BACKGROUND ART

An electronic circuit on the test head of a semiconductor testing apparatus dedicated to input/output pins of a device under test (hereinafter referred to as "DUT") is called pin electronics. The pin electronics comprises a driver for applying a predetermined signal to the pins of a DUT, a comparator for determining the level of a signal (High or Low) outputted from the DUT, and a programmable load circuit which acts as a load when a signal is outputted from the DUT.

A load condition for the programmable load circuit may be changed by a processor for controlling the entire semiconductor testing apparatus, and any load may be created as defined in the specifications of a DUT.

FIG. 1 is a circuit diagram showing an exemplary configuration of a programmable load circuit.

In FIG. 1, pin electronics comprise driver 3, comparator 4, and programmable load circuit 1, to which DUT 2 is connected for conducting a test.

Programmable load circuit 1 comprises a diode bridge composed of four diodes D3–D6; first current source 14 and second current source 15 acting as loads for DUT 2; programmable voltage source 20 for applying to the diode bridge threshold voltage Vth which serves as a decision standard for selecting first current source 14 or second current source 15, both of which act as loads for DUT 2; transistors Q5–Q8 serving as switches for connecting first current source 14 and second current source 15 to the diode bridge or to a ground potential; first regulated voltage source 18 (negative voltage source) for discharging node A when programmable load circuit 1 is OFF; second regulated voltage source 19 (positive voltage source) for charging node B when programmable load circuit 1 is OFF; diode D1 serving as a switch for connecting node A with first regulated voltage 18; diode D2 serving as a switch for connecting node B with second regulated voltage source 19; ON/OFF signal source 11 for outputting a signal for controlling programmable load circuit 1 to turn ON/OFF; third current source 16 for drawing a voltage at node B into output voltage Vp of second regulated voltage source 19 when programmable load circuit 1 is OFF; fourth current source 17 for drawing a voltage at node A into output voltage Vm of first regulated voltage source 18 when programmable load circuit 1 is OFF; transistors Q1–Q4 serving as switches for switching current paths of third current source 16 and fourth current source 17; and first level shift circuit 12 and second level shift circuit 13 for driving transistors Q1–Q8 in accordance with an output signal of ON/OFF signal source 1.

The ON of programmable load circuit 1 refers to a state in which first current source 14 or second current source 15 is connected to DUT 2 as a load, whereas the OFF of programmable load circuit 1 refers to a state in which first current source 14 and second current source are respectively connected to the ground potential and no load is connected to DUT 2.

Also, output voltage Vth of programmable voltage source 20, output current $I_1$ of first current source 14, and output current $I_2$ of second current source 15 are each variable, and are set to predetermined values with programming processing.

In such a configuration, when a signal is outputted from DUT 2, the output of driver 3 is maintained in a high impedance state, and programmable load circuit 1 is set ON. Programmable load circuit 1 is ON/OFF controlled by an output signal of ON/OFF signal source 11 such that it turns ON when a signal at High level is outputted from ON/OFF signal source 11.

When a signal at High level is outputted from ON/OFF signal source 11, first level shift circuit 12 supplies a base current to transistors Q1 and Q6, while second level shift circuit 13 supplies a base current to transistors Q3 and Q8. At this time, transistors Q2, Q4, Q5, Q7 are OFF, while transistors Q1, Q3, Q6, Q8 turn ON.

When transistors Q1 and Q3 turn ON, third current source 16 and fourth current source 17 are connected to the ground potential through transistors Q1 and Q3, respectively.

When a signal at High level is outputted from DUT 2 in such a state, current $I_2$ flows from DUT 2 to second current source 15 through diode D6 since the output voltage of DUT 2 is a voltage higher than threshold voltage Vth.

On the other hand, when a Low level is outputted from DUT 2, current $I_1$ flows from first current source 14 to DUT 2 through diode D4 since the output voltage of DUT 2 is a voltage lower than threshold voltage Vth.

Therefore, a load connected to the output of DUT 2 is switched in accordance with its output voltage and the value of the load is determined by current value $I_1$ of first current source 14 and current value $I_2$ of second current source 15.

Since programmable voltage source 20, first current source 14, and second current source 15 may respectively change their output values with programming processing, current values $I_1$, $I_2$, which act as loads, may be changed in accordance with the specifications of DUT 2.

On the other hand, when DUT 2 is switched into a signal input state, a signal is outputted from driver 3 to DUT 2, and the output of DUT 2 is set in a high impedance state. Additionally, since no load needs to be connected, programmable load circuit 1 is set OFF.

Programmable load circuit 1 turns OFF when a signal at Low level is outputted from ON/OFF signal source 11. When a Low level is outputted from ON/OFF signal source 11, first level shift circuit 12 supplies a base current to transistors Q2 and Q5, while second level shift circuit 13 supplies a base current to transistors Q4 and Q7. In this event, transistors Q1, Q3, Q6, Q8 are OFF respectively, and transistors Q2, Q4, Q5, Q6 turn ON respectively.

When transistors Q2 and Q4 turn ON, third current source 16 and node B are connected through transistor Q2 to charge a parasitic capacitance at node B to (Vp plus forward voltage $V_F$ of diode D2).

Additionally, fourth current source 17 and node A are connected through transistor Q4 to discharge a parasitic capacitance at node A to (Vm minus forward voltage $V_F$ of diode D5).

On the other hand, when transistors Q5, Q7 turn ON, first current source 14 is connected to the ground potential through transistor Q5, while second current source 15 is connected to the ground potential through transistor Q7. Thus, connection of DUT 2 with first current source 14 and second current source 15, which act as loads therefore, is disconnected.

In such a programmable load circuit and driver having the pin electronics, it is desirable that leakage current be smaller to provide more accurate testing in an output disabled state.

With programmable load circuit 1 shown in FIG. 1, leakage current $I_{leakage}$ is expressed as $I_{leakage}=I_{D4}-I_{D6}$ in the disabled state, i.e., when programmable load circuit 1 is OFF.

The programmable load circuit shown in FIG. 1 is a circuit which sets the output in a high impedance state by backwardly biasing a diode or a transistor. When high speed diodes, transistors or the like are used in such a circuit, the leakage current is increased by backward biasing because of the general tendency that faster devices exhibit a lower backward withstand voltage.

For this reason, when the source current (current consumed) of DUT 2 is measured, leakage current of the pin electronics affects the respective pins of DUT 2, causing a deterioration of the measuring accuracy of a semiconductor testing apparatus.

The present invention has been made to solve the aforementioned inherent problem in the prior art, and it is an object to provide a leakage current correcting circuit which is capable of reducing a leakage current which flows into an output of a programmable load circuit or a driver in order to improve the measuring accuracy of a semiconductor testing apparatus.

DISCLOSURE OF THE INVENTION

The present invention relates to a leakage current correcting circuit for reducing a leakage current which flows into an output of a circuit in a high impedance state, wherein the leakage current correcting circuit is constructed to have a correcting circuit for detecting a leakage current and cause a current to flow for offsetting the leakage current flowing into the output of the circuit.

In this way, the leakage current flowing into the output of the circuit is offset by the current outputted from the correcting circuit, thereby making it possible to reduce the leakage current.

BRIEF DESCRIPTION OF THE DRAWINGS

FIG. 5 is a circuit diagram showing another exemplary configuration of a current mirror circuit included in the leakage current correcting circuit.

BEST MODE FOR CARRYING OUT THE INVENTION

Next, the present invention will be described with reference to the drawings.

Figure 1:
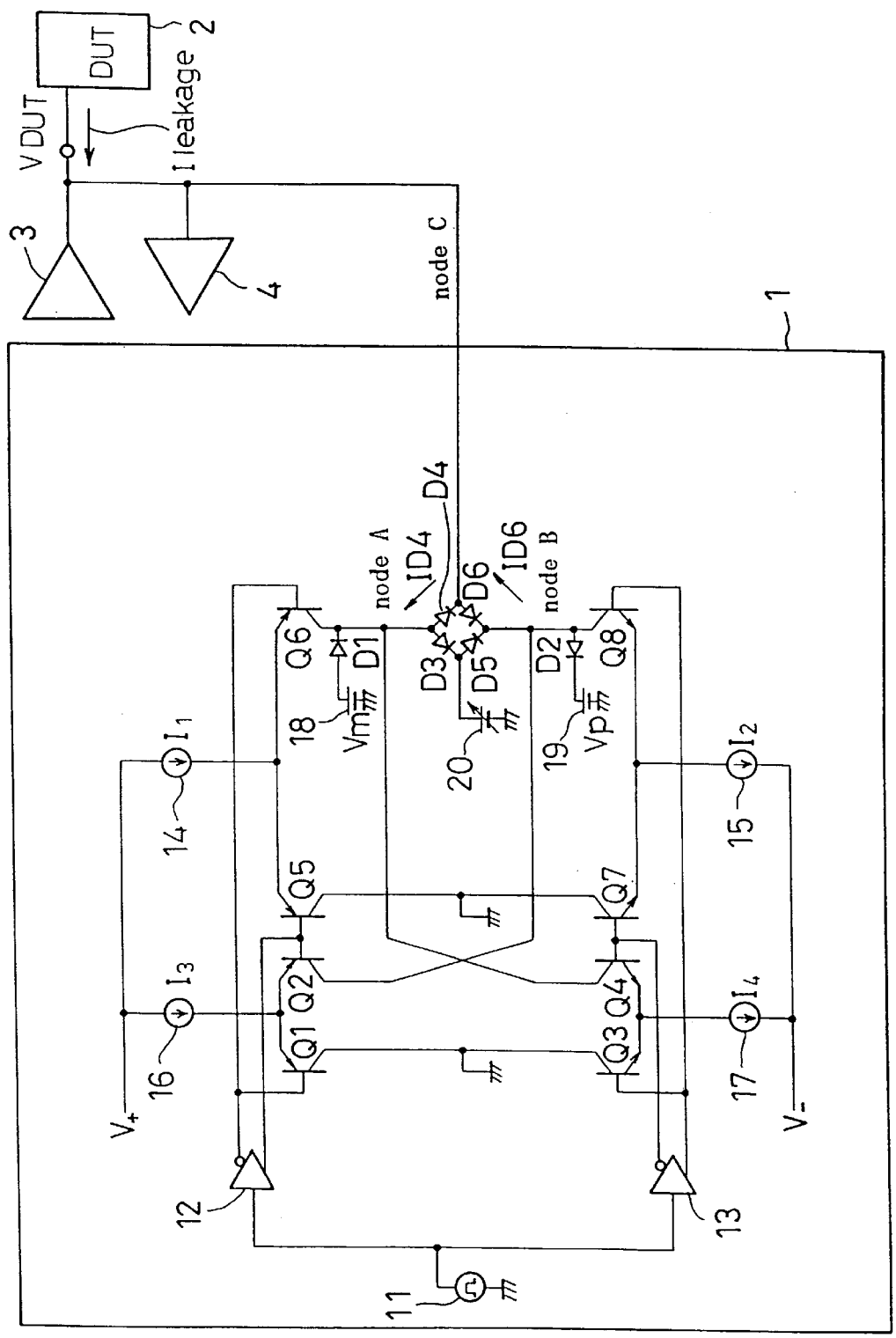
FIG. 1 is a circuit diagram showing an exemplary configuration of a programmable load circuit.
Figure 2:
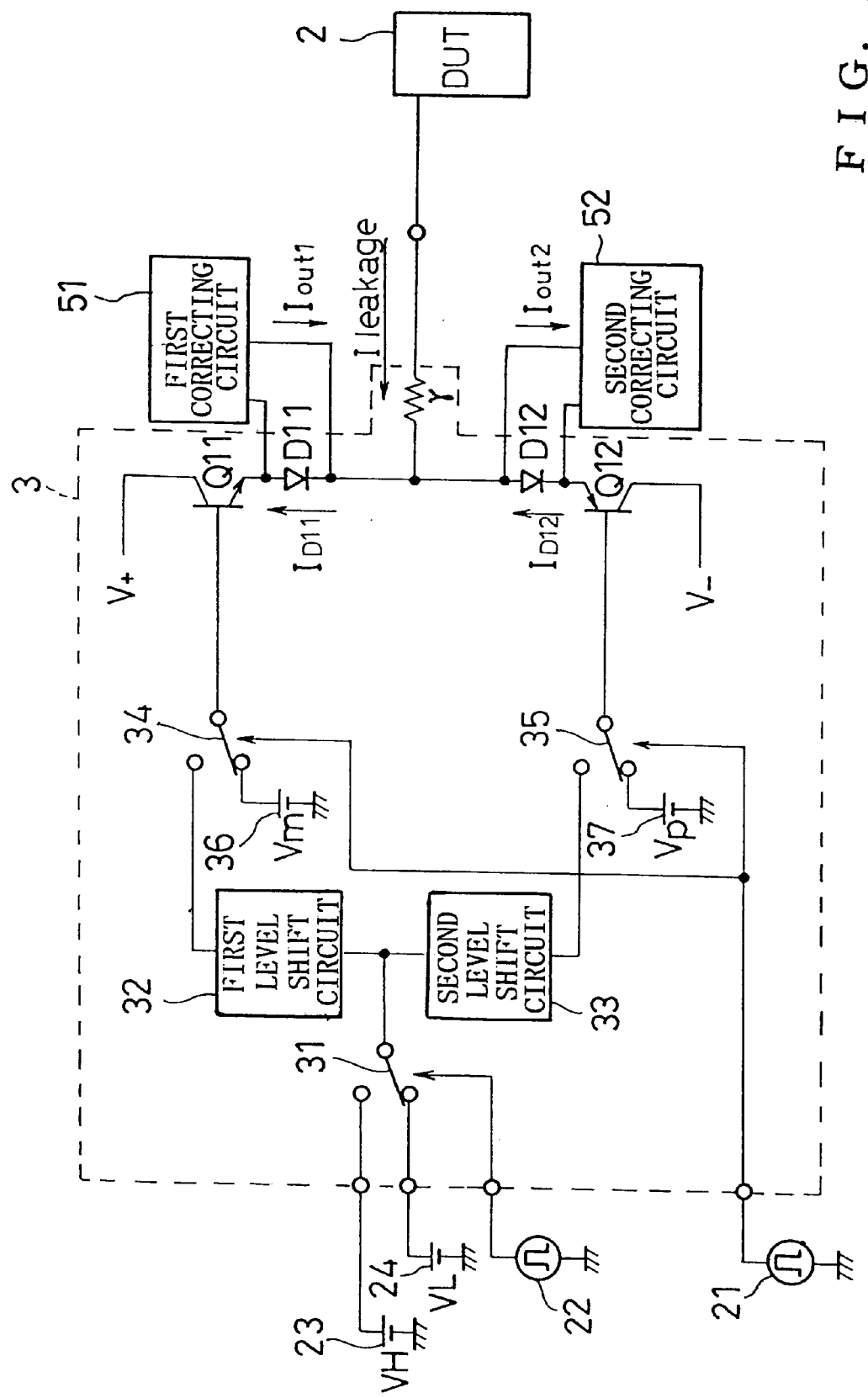
FIG. 2 is a circuit diagram showing a configuration of a leakage current correcting circuit according to the present invention.

FIG. 2 is a circuit diagram showing a configuration of a leakage current correcting circuit according to the present invention. FIG. 2 shows a configuration in which the leakage current correcting circuit according to the present invention is added to driver 3 shown in FIG. 1.

In FIG. 2, driver 3 comprises transistors Q11 and Q12 for applying a predetermined signal to DUT 2; diodes D11 and D12 connected in series with transistors Q11 and Q12; first switch 34 for switching a voltage applied to the base of transistor Q1; second switch 35 for switching a voltage applied to the base of transistor Q12; first regulated voltage source 36 for applying negative voltage Vm to the base of transistor Q11 when driver 3 is OFF to turn transistor Q11 OFF; second regulated voltage source 37 for applying positive voltage Vp to the base of transistor Q12 when driver 3 is OFF to turn transistor Q12 OFF; first level shift circuit 32 for applying a driving voltage to the base of transistor Q11 when driver 3 is ON; second level shift circuit 33 for applying a driving voltage to the base of transistor Q12 when driver 3 is ON; and third switch 31 for switching voltages applied to first level shift circuit 32 and second level shift circuit 33.

Driver 3 is connected to third regulated voltage source 23 for supplying a High level voltage applied to first level shift circuit 32 and second level shift circuit 33; fourth voltage source 24 for supplying a Low level voltage; H/L signal source 22 for outputting a signal for switching third switch 31 of driver 3; and ON/OFF signal source 21 for outputting a signal for controlling driver 3 to turn ON/OFF. Driver 3 is controlled by these circuits.

In such a configuration, when driver 3 is OFF, i.e., in a disabled state, transistors Q11 and Q12 are OFF, so that the output of driver 3 is in a high impedance state. At this time, it is desirable that the leakage current flowing into the output be smaller. However, leakage current $I_{leakage}$ actually flows through diodes D11, D12 and transistors Q11, Q12, and its value is expressed by:

$$I_{leakage}=I_{D11}-I_{D12}$$

The leakage current correcting circuit according to the present invention comprises first correcting circuit 51 for correcting a leakage current flowing through diode D11, and second correcting circuit 52 for correcting a leakage current flowing through diode D12.

First correcting circuit 51 detects current $I_{D11}$ flowing through diode D11, and has current $I_{out1}$ having a current value equal to $I_{D11}$ and the opposite polarity flow into the output of driver 3.

Similarly, second correcting circuit 52 detects current $I_{D12}$ flowing through diode D12, and has current $I_{out2}$ having a current value equal to $I_{D12}$ and the opposite polarity flow into the output of driver 3.

In this event, a leakage current $I_{leakage}$ flowing into the output of driver 3 is:

$$I_{leakage}=I_{D11}-I_{out1}-I_{D12}+I_{out2}=0$$

Thus, the measuring accuracy of the semiconductor testing apparatus is improved since the leakage current, viewed from DUT 2, can be reduced.

Next, the present invention will be described more specifically with reference to embodiments.

(First Embodiment)

Figure 3:
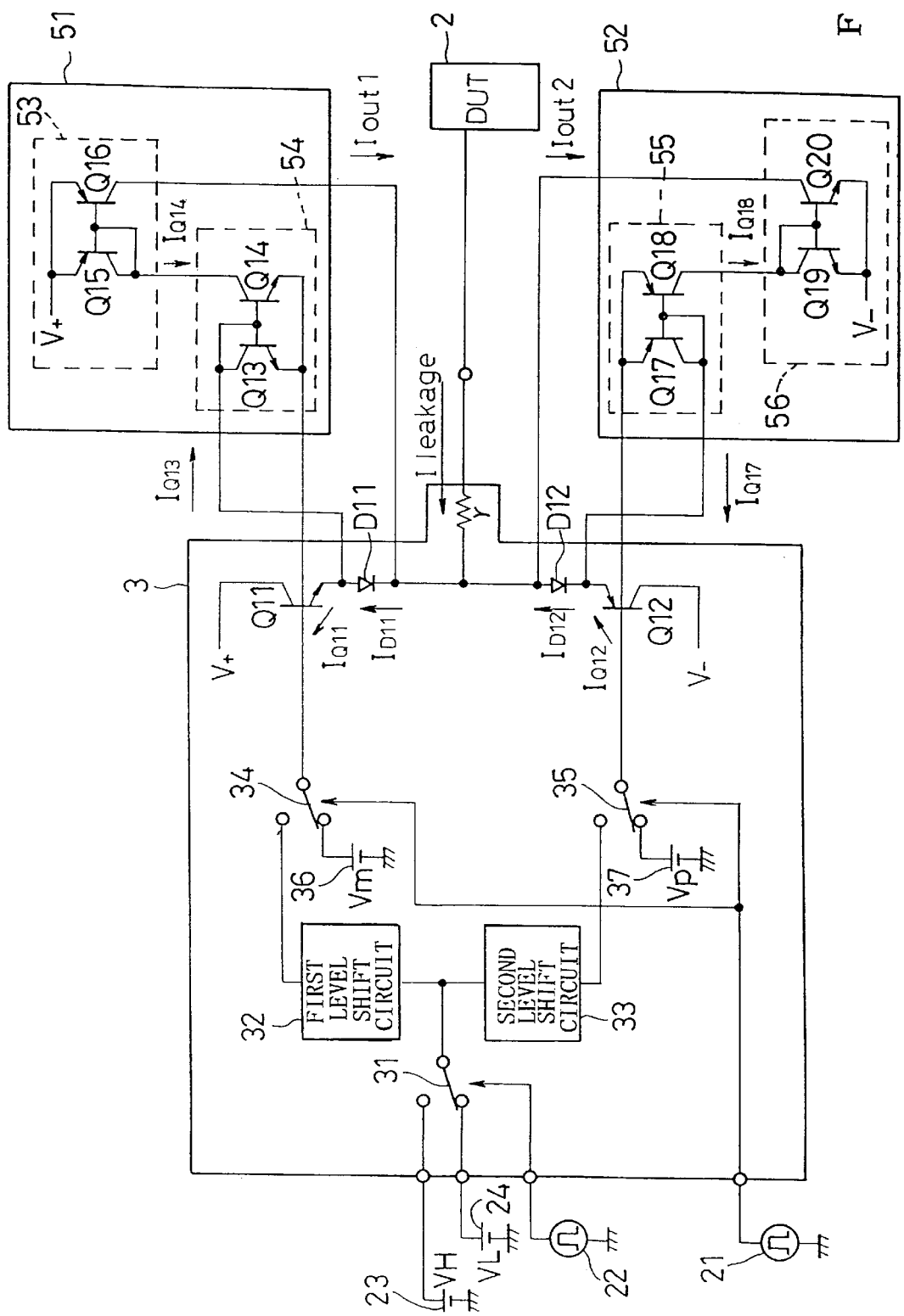
FIG. 3 is a circuit diagram showing a configuration of a first embodiment of the leakage current correcting circuit according to the present invention.

FIG. 3 is a circuit diagram showing a configuration of a first embodiment of the leakage current correcting circuit according to the present invention. In this embodiment, a specific example of a circuit will be illustrated for the leakage current correcting circuit added to driver 3 shown in FIG. 2.

In FIG. 3, the leakage current correcting circuit according to the embodiment comprises first correcting circuit 51 for correcting a leakage current flowing into diode D11 of driver 3, and second correcting circuit 52 for correcting a leakage current flowing through diode D12 of driver 3.

First correcting circuit 51 includes a first current mirror circuit 54 which is formed from transistors Q13 and Q14 and receives leakage current $I_{D11}$ flowing through diode D11 to output a current equal to $I_{D11}$; and a second current mirror circuit 53 which is formed from transistors Q15 and Q16 and receives the current outputted from first current mirror circuit 54 for causing current $I_{out}$ having the opposite polarity to leakage current $I_{D11}$ flow into the output of driver 3.

Second correcting circuit 52 includes a third current mirror circuit 55 which is formed from transistors Q17 and Q18 and receives a leakage current $I_{D12}$ flowing into diode D12 to output a current equal to $I_{D12}$; and a fourth current mirror circuit 56 which is formed from transistors Q19 and Q20 and receives the current outputted from third current mirror 55 for causing current $I_{out2}$ having the opposite polarity to leakage current $I_{D12}$ flow into the output of driver 3.

Next, the operation of the leakage current correcting circuit will be described in the configuration shown in FIG. 3.

When driver 3 is in a disabled state, backward voltages are applied across diode D11 and the base-to-mitter of transistor Q11 respectively since negative voltage Vm is applied to the base of transistor Q11. At this time, backward current $I_{D11}$ (leakage current) flows through diode D11, while backward current $I_{Q11}$ flows through the base-emitter of transistor Q11.

Since the backward voltage applied across the base-emitter of transistor Q11 is limited to approximately 0.7 volts which is a forward voltage across the base-emitter of transistor Q13 in first current mirror circuit 54, the value of $I_{Q11}$ becomes extremely small and it is negligible. In other words:

$$I_{D11}=I_{Q13}+I_{Q11}=I_{Q13}$$

Since first current mirror circuit 54 and second current mirror 53 respectively operate to equalize input and output currents, $I_{Q13}$ which is the input current to first current mirror circuit 54, $I_{Q14}$ which is the output current for first current mirror circuit 54 and the input current for second current mirror circuit 53, and $I_{out1}$ which is the output current from second current mirror circuit 53 respectively have equal values.

Thus, current $I_{D11}$ flowing through diode D11 and output current $I_{out1}$ from first correcting circuit 51 have equal current values and opposite polarities, as shown in FIG. 3.

Similarly, $I_{Q17}$ which is the input current of third current mirror circuit 55 in second correcting circuit 52, $I_{Q18}$ which is the output current from third current mirror circuit 55 and the input current to fourth current mirror circuit 56, and output current $I_{out2}$ for fourth current mirror circuit 56 respectively have equal values, so that current $I_{D12}$ flowing through diode D12 and output current $I_{out2}$ of second correcting circuit 52 have equal current values and opposite polarities, as shown in FIG. 3.

Thus, the leakage current $I_{leakage}$ of driver 3, viewed from DUT 2, is expressed by:

$$I_{leakage}=I_{D11}-I_{out1}-I_{D12}+I_{out2}=0$$

(Second Embodiment)

Figure 4:
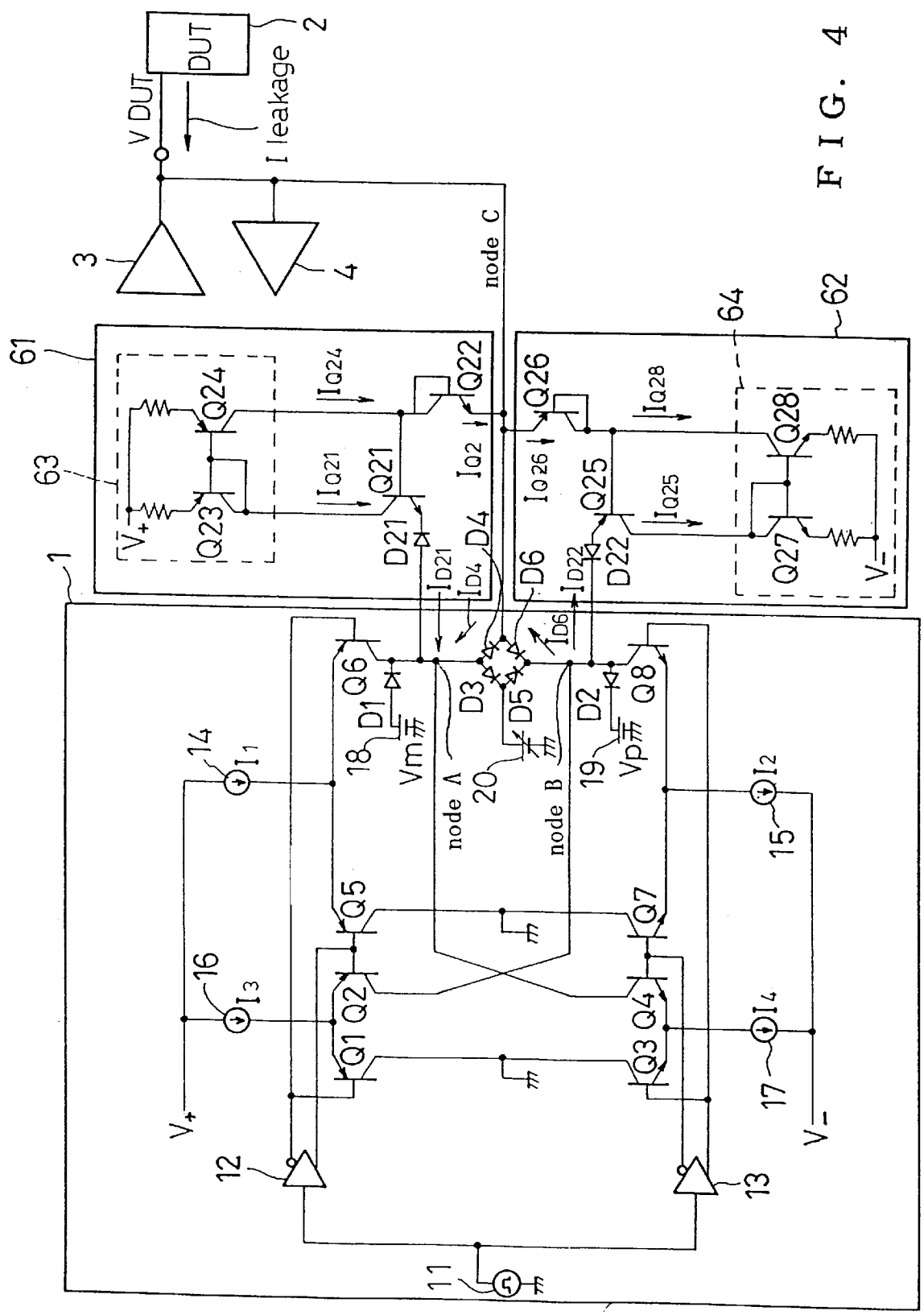
FIG. 4 is a circuit diagram showing a configuration of a second embodiment of the leakage current correcting circuit according to the present invention.

FIG. 4 is a circuit diagram showing a configuration of a second embodiment of the leakage current correcting circuit according to the present invention. The leakage current correcting circuit according to this embodiment has a configuration in which the leakage current correcting circuit according to the present invention is added to the programmable load circuit shown in FIG. 1.

In FIG. 4, the leakage current correcting circuit according to the embodiment comprises first correcting circuit 61 for correcting a leakage current flowing into diode D4 of programmable load circuit 1; and second correcting circuit 62 for correcting a leakage current flowing into diode D6 of programmable load circuit 1.

First correcting circuit 61 includes diode D21 having the same characteristic as that of diode D4 in programmable load circuit 1; transistor Q21 which has its emitter connected to node A through diode D21 and into which a current equal to current $I_{D4}$ flowing through diode D4 flows; first current mirror circuit 63 which receives current $I_{Q21}$ flowing through transistor Q21 as an input current to output current $I_{Q24}$ equal to input current $I_{Q21}$; and transistor Q22 which receives output current $I_{Q24}$ from first current mirror circuit 63 as an input to have current $I_{Q22}$ equal to $I_{Q24}$ flow into an output (node C) of programmable load circuit 1.

Second correcting circuit 62 comprises diode D22 having the same characteristic as that of diode D6 in programmable load circuit 1; transistor Q25 which has its emitter connected to node B through diode D22 and into which a current equal to current $I_{D6}$ flowing through diode D6 flows; second current mirror circuit 64 which receives current $I_{Q25}$ flowing through transistor Q25 as an input current to output current $I_{Q28}$ equal to input current $I_{Q25}$; and transistor Q26 which receives output current $IQ_28$ of second current mirror circuit 64 to have current $I_{Q26}$ equal to $IQ_{28}$ flow into the output (node C) of programmable load circuit 1.

Next, the operation of the leakage current correcting circuit will be described in the configuration illustrated in FIG. 4.

When programmable load circuit 1 is in a disabled state, since Vm− (forward voltage $V_F$ of diode D1) is applied to node A, a backward voltage is applied to diode D4, causing backward current (leakage current) $I_{D4}$ to flow therethrough. In this event, the backward voltage applied to diode D4 is equally applied to diode D21, so that $I_{D4}=I_{D21}$ stands.

Assuming that transistor Q21 has sufficiently large $h_{FE}$ and a base current of transistor Q21 is negligible, $I_{D21}=I_{Q21}$ stands.

First current mirror circuit 63 outputs current $I_{Q24}$ substantially equal to $I_{Q21}$, and transistor Q22 has current $I_{Q22}$ substantially equal to $I_{Q24}$ flow into node C. In other words, $I_{D4}=I_{Q22}$ stands (however, as shown in FIG. 4, $I_{D4}$ and $I_{Q22}$ are opposite in polarity).

Similarly, since Vp+ (forward voltage $V_F$ of diode D2) is applied to node B, a backward voltage is applied to diode D6, causing leakage current $I_{D6}$ to flow therethrough. At this time, the backward voltage applied to diode D6 is equally applied to diode D22, so that $I_{D6}=I_{D22}$ stands.

Assuming that transistor Q25 has sufficiently large $h_{FE}$, and a base current of transistor Q25 is negligible, and $I_{D22}=I_{Q25}$ stands.

Second current mirror circuit 64 outputs current $I_{Q28}$ substantially equal to $I_{Q25}$, and transistor Q26 has current $I_{Q26}$ substantially equal to $I_{Q28}$ flow into node C. In other words, $I_{D6}=I_{Q26}$ stands (however, as shown in FIG. 4, $I_{D6}$ and $I_{Q26}$ are opposite in polarity).

Thus, leakage current $I_{leakage}$ of programmable load circuit 1, viewed from DUT 2, is expressed by:

$$I_{leakage}=I_{D4}-I_{Q22}-I_{D6}+I_{26}=0$$

The respective current mirror circuits shown in FIG. 3 and FIG. 4 show the simplest configurations. The respective current mirror circuits are not limited to these configuration, and with the use of a known current mirror circuit capable of reducing the influence of a base current as shown in FIG. 5, it is possible to provide a leakage current correcting circuit which further reduces errors. Additionally, each of diodes D11, D12 shown in FIG. 3 and diodes D1–D6, D21, D22 shown in FIG. 4 may be replaced with a circuit which has a transistor having its base and its collector connected to each other.

INDUSTRIAL APPLICABILITY

The leakage current correcting circuit according to the present invention is useful in a circuit which sets an output in a high impedance state by backwardly biasing a diode or a transistor, and is particularly suitable for a driver or a programmable load circuit in pin electronics for a semiconductor testing apparatus.

What is claimed is:

1. A leakage current correcting circuit for reducing a leakage current flowing into an output of a tri-state driver, comprising:
   a correcting unit for detecting the leakage current and causing a current to flow for offsetting said leakage current flowing into the output of the driver; wherein:
   said correcting unit includes:
   a current detecting circuit for detecting the leakage current and outputting a current equal to the leakage current; and
   a current supply circuit for receiving the output current from said current detecting circuit as input and causing a current to flow for offsetting said leakage current flowing into the output of said driver; and
   said current detecting circuit is a current mirror circuit.

2. The leakage current correcting circuit according to claim 1, wherein said current supply circuit is a current mirror circuit.

3. A leakage current correcting circuit for reducing a leakage current flowing into an output of a circuit in a high impedance state, comprising:
   a correcting unit for detecting the leakage current and causing a current to flow for offsetting said leakage current flowing into the output of the circuit, wherein:
   said correcting unit includes:
   a first circuit for detecting the leakage current and outputting a current equal to the leakage current;
   a second circuit for receiving the output current from said first circuit as input for outputting a current having the opposite polarity to that of the output current; and
   a third circuit for receiving the output current from said second circuit as an input and causing a current to flow for offsetting said leakage current flowing into the output of said circuit; and
   said first circuit includes:
   a diode through which a current equal to the leakage current flows; and
   a transistor having an emitter connected in series to said diode, and a collector from which a current equal to the leakage current is outputted.

4. The leakage current correcting circuit according to claim 3, wherein said second circuit is a current mirror circuit.

5. The leakage current correcting circuit according to claim 3, wherein said third circuit includes:
   a transistor having a base and a collector connected in common, said transistor receiving the output current from said second circuit to output from an emitter thereof a current for offsetting said leakage current.

* * * * *